(12) United States Patent
Wang et al.

(10) Patent No.: US 8,574,958 B2
(45) Date of Patent: Nov. 5, 2013

(54) METHOD FOR MANUFACTURING A GATE-CONTROL DIODE SEMICONDUCTOR MEMORY DEVICE

(75) Inventors: Pengfei Wang, Shanghai (CN); Xiaoyong Liu, Shanghai (CN); Qingqing Sun, Shanghai (CN); Wei Zhang, Shanghai (CN)

(73) Assignee: Fudan University, Shanghai (CN)

( * ) Notice: Subject to any disclaimer, the term of this patent is extended or adjusted under 35 U.S.C. 154(b) by 0 days.

(21) Appl. No.: 13/535,032

(22) Filed: Jun. 27, 2012

(65) Prior Publication Data

US 2013/0178014 A1    Jul. 11, 2013

(30) Foreign Application Priority Data

Jan. 5, 2012   (CN) .......................... 2012 1 0001500

(51) Int. Cl.
*H01L 21/00* (2006.01)
(52) U.S. Cl.
USPC .................................. 438/104; 257/E45.003
(58) Field of Classification Search
USPC .............................. 438/104; 257/43, E45.003
See application file for complete search history.

(56) References Cited

U.S. PATENT DOCUMENTS

| | | | | |
|---|---|---|---|---|
| 7,994,588 B2 * | 8/2011 | Yin et al. | ...................... | 257/390 |
| 8,486,754 B1 * | 7/2013 | Wang et al. | .................... | 438/104 |
| 2006/0152961 A1 * | 7/2006 | Kim et al. | ...................... | 365/148 |
| 2009/0057745 A1 * | 3/2009 | Yin et al. | ...................... | 257/315 |
| 2011/0059576 A1 * | 3/2011 | Cho et al. | ...................... | 438/104 |

* cited by examiner

*Primary Examiner* — William D Coleman
(74) *Attorney, Agent, or Firm* — Jenkins, Wilson, Taylor & Hunt, P.A.

(57) ABSTRACT

This invention belongs to semiconductor device manufacturing field and discloses a method for manufacturing a gate-control diode semiconductor storage device. When the floating gate voltage is relatively high, the channel under the floating gate is of n type and a simple gate-control pn junction structure is configured; by controlling effective n-type concentration of the ZnO film through back-gate control, inverting the n-type ZnO into p-type through a floating gate and using NiO as a p-type semiconductor, an n-p-n-p doping structure is formed while the quantity of charges in the floating gate determines the device threshold voltage, thus realizing memory functions. This invention features capacity of manufacturing gate-control diode memory devices able to reduce the chip power consumption through advantages of high driving current and small sub-threshold swing. This invention is applicable to semiconductor devices manufacturing based on flexible substrate and flat panel displays and floating gate memories, etc.

6 Claims, 3 Drawing Sheets

Prior Art

METHOD FOR MANUFACTURING A GATE-CONTROL DIODE SEMICONDUCTOR MEMORY DEVICE

CROSS-REFERENCE TO RELATED APPLICATION

This application claims priority to Chinese Patent Application No. CN 201210001500.8 filed on Jan. 5, 2012, the entire content of which is incorporated by reference herein.

BACKGROUND OF THE INVENTION

1. Technical Field

The present invention belongs to the technical field of semiconductor memory device manufacturing, relates to a method for manufacturing a semiconductor memory device, and more especially, to a method for manufacturing a gate-control diode semiconductor memory device.

2. Description of Related Art

The structure of the mainstream floating gate transistor at present is as shown in FIG. 1, including a drain 102 and a source 103 formed in a substrate 101, and polycrystalline silicon gates 105 and 107 formed on the substrate 101, wherein the electrically-connected polycrystalline silicon gate 107 is called "control gate" and the floating polycrystalline silicon gate 105 is called "floating gate". The floating gate 105 is isolated with the substrate 101 and the control gate 107 through insulation dielectric layers 104 and 106 respectively. The floating gate technology is first applied to EPROM and EEPROM.

The floating gate transistor, of which the working principle is that the transistor threshold voltage is changed according to the fact of whether there are charges stored or how many charges are stored on the floating gate so as to change the external features of the transistor, has now become the basic device structure of on-volatile semiconductor memories. Currently, with the continuous development of integrated circuits, the size of MOSFET (metal-oxide-semiconductor field-effect transistor) is becoming smaller and smaller, and the transistor density on unit arrays is becoming higher and higher. The leakage current between the source and the drain of the MOSFET is increasing rapidly with the decrease of channel length. All these seriously affect the maintenance of the electrons on the floating gate. With the repeating of erasing and writing, the channel insulation film will be damaged, which may cause the leakage of electrons in the floating gate. Moreover, the minimum sub-threshold swing (SS) of the traditional MOSFET is limited to 60 mv/dec, which restricts the opening and closing speed of the transistor.

BRIEF SUMMARY OF THE INVENTION

In view of this, the present invention aims at providing a method for manufacturing semiconductor memory devices capable of decreasing the leakage current and the SS value of floating gate memory devices so as to improve the performances thereof.

The memory device provided in the present invention adopts the positive feedback automatic gain principle. Namely, when the doping type of a planar semiconductor device is p-n-p-n, two pairs of interdependent triodes, p-n-p and n-p-n, are generated. Usually, the two triodes can be magnified mutually, which may cause the increase of the device current and further cause the breakdown of the device in severe cases. To apply this characteristic into thin-film semiconductors, a gate-control diode semiconductor memory based on the ZnO semiconductor material is provided in the present invention. When the floating gate voltage is high and the channel under the floating gate is of n type, the device is of simple gate-control pn junction structure. By way of controlling the effective n type concentration of the ZnO film from the back gate, inverting the n-type ZnO to p-type through the floating gate and using NiO as a p-type semiconductor, an n-p-n-p doping structure is formed. The quantity of charges in the floating gate determines the device threshold voltage, thus realizing the memory functions.

A method for manufacturing the gate-control diode semiconductor memory device above is provided in the present invention, including the following steps:

provide a heavily-doped n-type silicon substrate;
form a first kind of insulation film on the n-type silicon substrate;
form a ZnO layer on the first kind of insulation film;
etch the ZnO layer to faun an active region;
cover the active region to form a NiO layer doped with p-type impurity ions;
photoetch a pattern, etch the NiO layer and preserve the NiO layer on one side of the ZnO active region to form a device source;
deposit a second kind of insulation film on the exposed NiO and ZnO surfaces;
deposit device floating gate conductive material on the surface of the second kind of insulation film;
define the pattern of the floating gate region thereof though photoetching and etching, wherein the floating gate region located between the NiO material on the ZnO active region and the edge of the other end of the ZnO, is in a square pattern, indirectly adjacent to the NiO with a spacing of 10 nm-100 µm, and is 10 nm-100 µm away from the edge of the ZnO;
form a third kind of insulation film on the surface of the floating gate conductive material and the exposed ZnO & NiO;
define the contact holes of the drain and the source by photoetching and etching the third kind of insulation film, and keep the third kind of insulation film on the floating gate region, wherein the contact holes of the drain and the source are on both sides of the floating gate region respectively, namely on the NiO and the ZnO respectively;
form a first kind of conductive film through deposition and etch the first kind of conductive film to form a drain electrode, a gate electrode and a source electrode which are independent of one another, wherein the source electrode makes contact with the NiO on one side of the floating gate region through the source contact hole, the drain electrode makes contact with the ZnO on the other side of the floating gate region through the drain contact hole and the gate electrode cover the non-etched third kind of insulation film on the floating gate region.

Further, the method for manufacturing a gate-control diode semiconductor memory device, characterized in that the first kind of insulation film is of silicon oxide and with a thickness of 1-500 nm.

Furthermore, the method for manufacturing a gate-control diode semiconductor memory device, characterized in that, the thickness of the ZnO dielectric layer is 1-100 nm, the second and third kinds of insulation film is of SiO2 or high dielectric constant material HfO2, the material of the floating gate includes but is not limit to polycrystalline silicon material and the first kind of conductive film is of heavily-doped polycrystalline silicon, copper, tungsten, aluminum, titanium nitride or tantalum nitride.

The method for manufacturing a gate-control diode semiconductor memory device provided in the present invention features simple process, low manufacturing cost and capacity of manufacturing gate-control diode memory devices able to reduce the chip power consumption through advantages of high driving current and small sub-threshold swing. Moreover, the present invention using low temperature process production is especially applicable to the manufacturing of semiconductor devices based on flexible substrates and devices such as flat panel displays and floating gate memories.

DETAILED DESCRIPTION OF THE INVENTION

Figure 1:
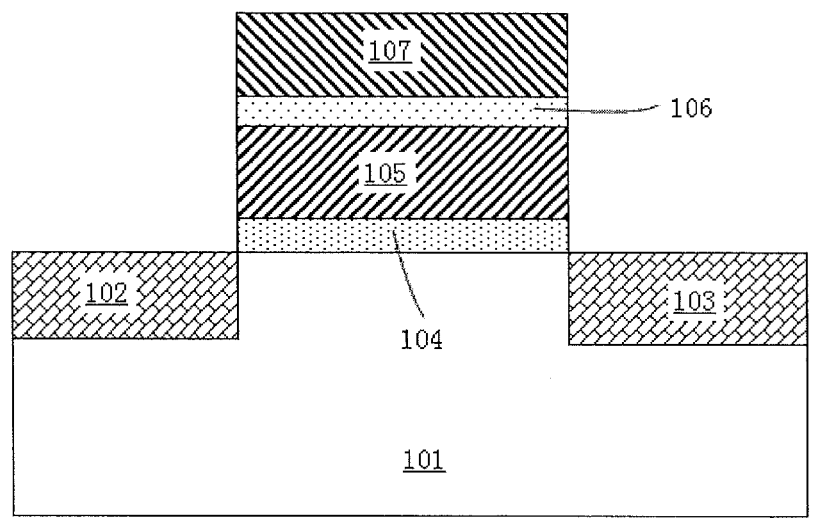
FIG. 1 is the schematic diagram of the structure of the existing floating gate transistor.

An exemplary embodiment of the present invention is further detailed herein by referring to the drawings. In the drawings, the thicknesses of the layers and regions are either zoomed in or out for the convenience of description, so it shall not be considered as the true size. Although these drawings cannot accurately reflect the true size of the device, they still reflect the relative positions among the regions and composition structures completely, especially the up-down and adjacent relations.

The reference diagrams are the schematic diagrams of the idealized embodiments of the present invention, so the embodiments shown in the present invention shall not be limited to specific shapes in areas shown in the drawings, while they shall include the obtained shapes such as the deviation caused by manufacturing. For instance, curves obtained through etching are often bent or rounded, while in the embodiments of the present invention, they are all presented in rectangles, and what the drawings present is schematic and shall not be considered as the limit to the present invention. Meanwhile, the term "substrate" used in the following description can be considered as a semiconductor substrate during manufacturing process, and other film layers prepared on it may also be included.

Figure 2:
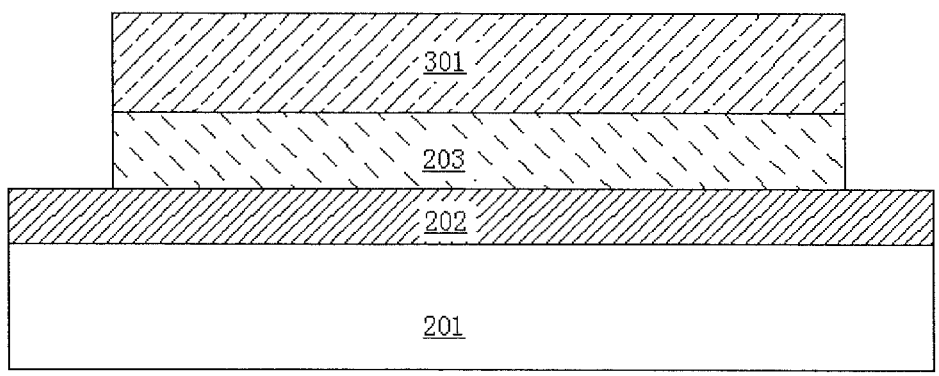
FIGS. 2-5 are the process flow diagrams of an embodiment of the method for manufacturing a gate-control diode semiconductor memory device disclosed in the present invention.

Firstly, develop a silicon oxide film 202 with a thickness of 20 nm on a provided silicon substrate 201 heavily doped with n-type impurity ions through thermal oxidization, and then deposit a ZnO film 203 with a thickness of 5 nm on the silicon oxide film 202 by atomic layer deposition. Afterwards, deposit a layer of photoresist 301 and form a pattern through masking film, exposal and development, and then etch the ZnO film 203 to form an active region, as shown in FIG. 2.

Figure 3:
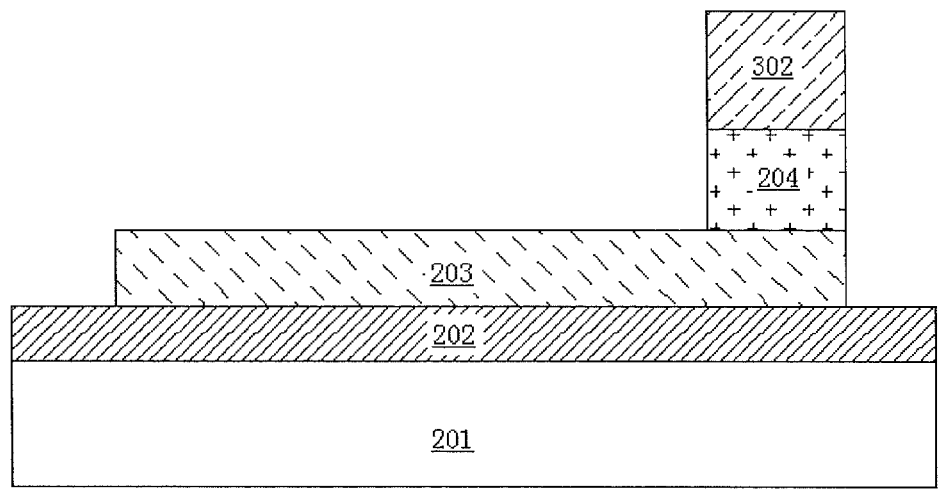

After removing the photoresist 301, deposit an NiO film doped with p-type impurity ions through Physical Vapor Deposition (PVD), then deposit another layer of photoresist 302, form a pattern through masking film, exposal and development, and etch the NiO film to form a device source 204, as shown in FIG. 3.

Figure 4:
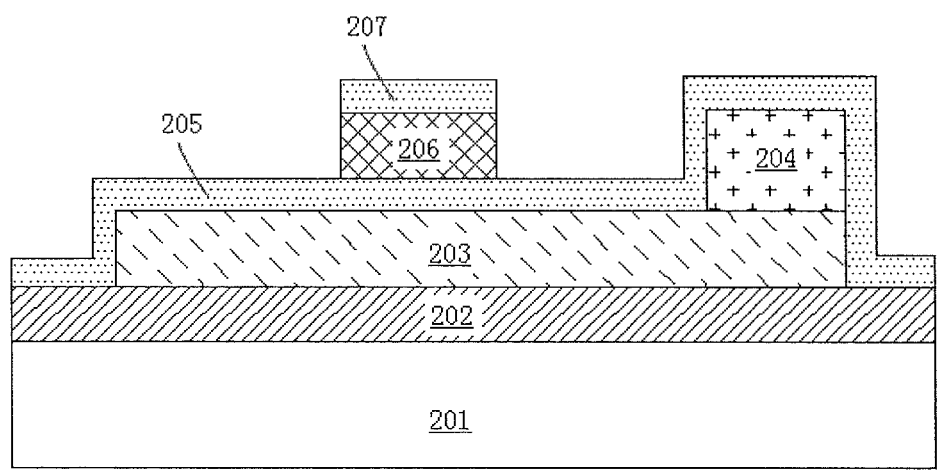

After removing the photoresist 302, deposit a layer of high dielectric constant material 205 such as HfO2, then deposit a layer of polycrystalline silicon material, etch the polycrystalline silicon deposited to form a device floating gate 206 and form an insulation dielectric layer 207 (for instance, of silicon oxide) on the floating gate 206, as shown in FIG. 4.

Figure 5:
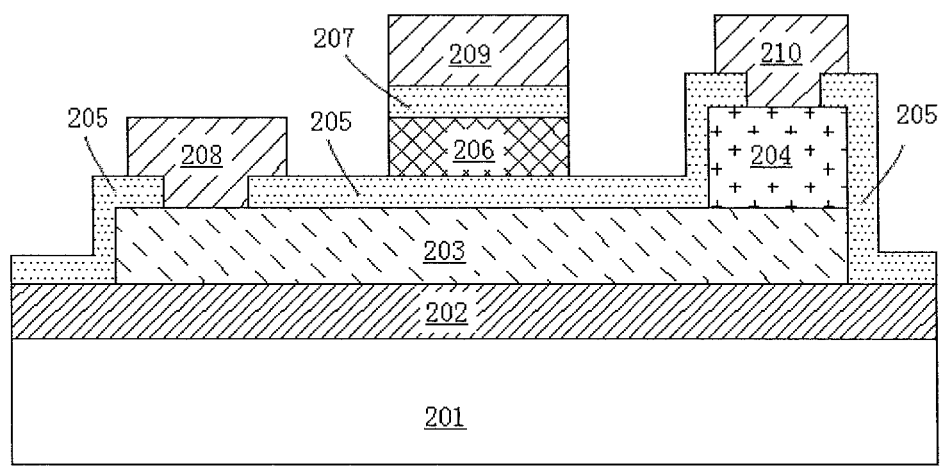

Finally, deposit a layer of photoresist and form a pattern through masking film, exposal and development, then etch the high dielectric constant material 205 to define the positions of the drain and the source, deposit a metal conductive film such as aluminum and form a drain electrode 208, a gate electrode 209 and a source electrode 210 through photoetching and etching, as shown in FIG. 5.

As described above, without deviating from the spirit and scope of the present invention, there may be many significantly different embodiments. It shall be understood that the present invention is not limited to the specific embodiments described in the Specification except those limited by the Claims herein.

What is claimed is:

1. A method for manufacturing the gate-control diode semiconductor memory device, characterized in that it includes the following steps:

provide a heavily-doped n-type silicon substrate;

form a first kind of insulation film on the n-type silicon substrate;

form a ZnO layer on the first kind of insulation film;

etch the ZnO layer to form an active region;

cover the active region to form a NiO layer doped with p-type impurity ions;

photoetch a pattern, etch the NiO layer and preserve the NiO layer on one side of the ZnO active region to form a device source;

deposit a second kind of insulation film on the exposed NiO and ZnO surfaces;

deposit device floating gate conductive material on the surface of the second kind of insulation film;

define the pattern of the floating gate region thereof though photoetching and etching, wherein the floating gate region located between the NiO material on the ZnO active region and the edge of the other end of the ZnO, is in a square pattern, indirectly adjacent to the NiO with a spacing of 10 nm-100 μm, and is 10 nm-100 μm away from the edge of the ZnO;

form a third kind of insulation film on the surface of the floating gate conductive material and the exposed ZnO & NiO;

define the contact holes of the drain and the source by photoetching and etching the third kind of insulation film, and keep the third kind of insulation film on the floating gate region, wherein the contact holes of the drain and the source are on both sides of the floating gate region respectively, namely on the NiO and the ZnO respectively;

form a first kind of conductive film through deposition and etch the first kind of conductive film to form a drain electrode, a gate electrode and a source electrode which are independent of one another, wherein the source electrode makes contact with the NiO on one side of the floating gate region through the source contact hole, the drain electrode makes contact with the ZnO on the other side of the floating gate region through the drain contact hole and the gate electrode cover the non-etched third kind of insulation film on the floating gate region.

2. The method for manufacturing a gate-control diode semiconductor memory device according to claim 1, characterized in that the first kind of insulation film is of silicon oxide and with a thickness of 1-500 nm.

3. The method for manufacturing a gate-control diode semiconductor memory device according to claim 1, characterized in that the thickness of the ZnO dielectric layer is 1-100 nm.

4. The method for manufacturing a gate-control diode semiconductor memory device according to claim 1, characterized in that the second and third kinds of insulation film are of $SiO_2$ or high dielectric constant material $HfO_2$.

5. The method for manufacturing a gate-control diode semiconductor memory device according to claim 1, characterized in that the floating gate is of polycrystalline silicon material.

6. The method for manufacturing a gate-control diode semiconductor memory device according to claim 1, characterized in that the first kind of conductive film is of heavily-doped polycrystalline silicon, copper, tungsten, aluminum, titanium nitride or tantalum nitride.

* * * * *